United States Patent [19]
Xiong et al.

[11] Patent Number: 5,989,673
[45] Date of Patent: Nov. 23, 1999

[54] CAROMIUM-TANTALUM OXIDES (CR-TAO$_x$), SPUTTERING TARGETS AND THIN FILM SEEDLAYER/SUBLAYERS FOR THIN FILM MAGNETIC RECORDING MEDIA

[75] Inventors: Wei Xiong, New City, N.Y.; Hung-Lee Hoo, Livingston, N.J.

[73] Assignees: Sony Corporation, Tokyo, Japan; Materials Research Corporation, Orangeburg, N.Y.

[21] Appl. No.: 08/885,943

[22] Filed: Jun. 30, 1997

[51] Int. Cl.$^6$ ...................................................... G11B 5/66
[52] U.S. Cl. ........................ 428/65.3; 428/65.7; 428/336; 428/408; 428/701; 428/702; 428/611; 428/666; 428/667; 428/693; 428/698; 428/694 T; 428/694 TS; 428/694 TP; 428/694 TC; 428/900; 427/127; 427/128; 427/130; 427/131; 204/192.2; 75/232; 75/234; 75/245; 75/246
[58] Field of Search .......................... 428/694 T, 694 TS, 428/694 TP, 694 TC, 900, 611, 666, 667, 693, 698, 336, 408, 79, 702, 65.7; 204/192.2; 427/127, 128, 131, 130; 75/232, 234, 245, 246

[56] References Cited

U.S. PATENT DOCUMENTS

| | | | |
|---|---|---|---|
| 4,941,920 | 7/1990 | Inui et al. | 75/246 |
| 5,004,652 | 4/1991 | Lal et al. | 428/611 |
| 5,057,380 | 10/1991 | Hayashi et al. | 428/692 |
| 5,439,500 | 8/1995 | Marx | 75/246 |
| 5,456,978 | 10/1995 | Lal | 428/332 |
| 5,620,574 | 4/1997 | Teng et al. | 204/192.15 |
| 5,721,033 | 2/1998 | Teng et al. | 428/65.3 |

FOREIGN PATENT DOCUMENTS

| | | |
|---|---|---|
| 8-041578 | 2/1996 | Japan . |

OTHER PUBLICATIONS

Duan, S., et al., "A Study of Magnetic Recording Media on Glass Substrates," *IEEE Trans. Magn.* 30(6), 3966–3968 (1994).

Johnson, K. E., et al., "The effect of Cr underlaying thickness on magnetic and structural properties of CoPtCr thin films," *J. Appl. Phys.* 67(9), 4686–4688 (1990).

Kogure, T., et al., "High–coercivity magnetic hard disks using glass substrates," *J. Appl. Phys.* 67(9), 4701–4703 (1990).

Kryder, M. H., et al., "Approaches to 10 Gbit/in.$^2$ Recording," *J. Appl. Phys.* 79(8), 4485–4490 (1996).

Lal, B. B., et al., "A New Series of Quaternary Co–Alloys for High Density Rigid–disk Applications," *IEEE Trans. Magn.* 27(6), 4739–4741 (1991).

Mahvan, N., et al., "Oxidation of Seed–Layer for Improved Magnetic & Recording Performance of Thin–Film Rigid Discs," *IEEE Trans. Magn.* 29(6), 3691–3693 (1993).

Sanders, I. L., et al., "Magnetic and Recording Characteristics of VeryThin Metal–Film Media," *IEEE Trans. Magn.* 25(5), 3869–3871 (1989).

Teng, E., et al., "Designing media with alternative substrate materials," *Data Storage*, pp. 35–40, Sep. 1994.

Tsai, H. C., "Advantage and Challenge of Nonmetallic Substrates for Rigid Disk Applications," *IEEE Trans. Magn.*, 29(1), 241–245 (1993).

Tsai, H. C., et al., "The Effects of Ni$_3$P–Sublayer on the Properties of CoNiCr/Cr Media Using Different Substrates," *IEEE Trans. Magn.*, 28(5), 3093–3095 (1992).

Xiong, W., et al., "Cobalt alloys and the search for 10–Gbit/in$^2$ recording," *Data Storage*, 3(6), 47–50 (1996).

*Primary Examiner*—Leszek Kiliman
*Attorney, Agent, or Firm*—Wood, Herron, Evans, L.L.P.

[57] ABSTRACT

Chromium-tantalum oxides (Cr-TaO$_x$), including chromium-tantalum pentoxide (Cr-Ta$_2$O$_5$), chromium-tantalum tetrioxide (Cr-Ta$_2$O$_4$ or Cr-TaO$_2$), sputtering targets containing them, and their manufacture are disclosed. The targets are characterized by high density, uniform TaO$_x$ distribution, low impedance and stable plasma during the sputtering. The Cr-Ta oxides are used as a thin film sublayer to improve the coercivity and other characteristics of magnetic recording media deposited on metallic or non-metallic substrates used in hard disks for data storage.

35 Claims, 6 Drawing Sheets

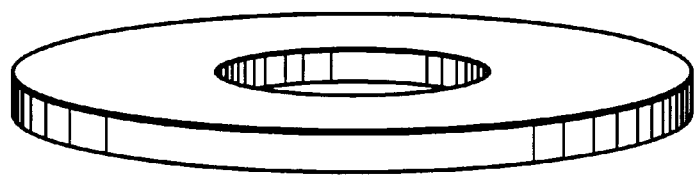
FIG. 5A
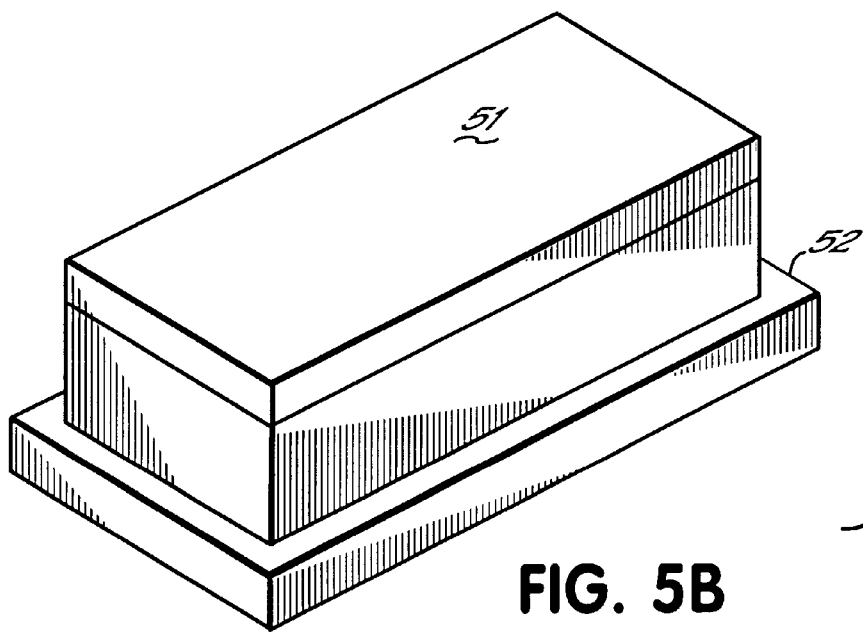
FIG. 5B
FIG. 5
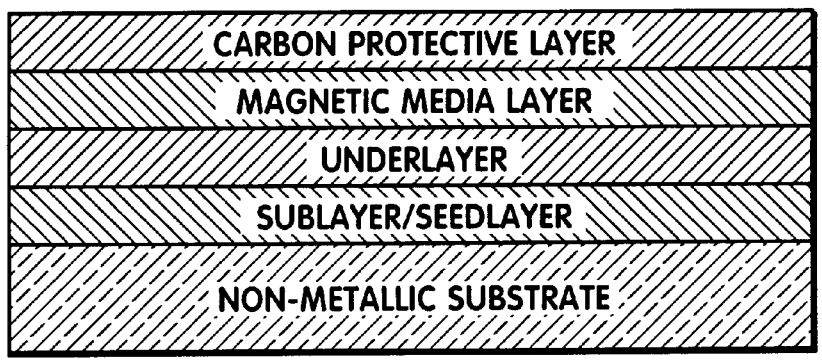
FIG. 6

5,989,673

CAROMIUM-TANTALUM OXIDES (CR-TAO$_x$), SPUTTERING TARGETS AND THIN FILM SEEDLAYER/SUBLAYERS FOR THIN FILM MAGNETIC RECORDING MEDIA

FIELD OF THE INVENTION

The present invention relates to chromium-tantalum oxides (Cr-TaO$_x$), sputtering targets containing Cr-TaO$_x$, their manufacture, and use as a sublayer to obtain high-coercivity, low-noise, and uniform thin film recording media on non-metallic substrates of hard disks for data storage.

BACKGROUND OF THE INVENTION

Thin film magnetic recording media are major elements of hard disk drives which are widely used in computers and other data storage devices. As the recording density continues to increase towards the next goal of 10 Gbit/in$^2$ and beyond, more efforts are being made to enhance media coercivity and to reduce noise. In addition to improving media alloys and structures, alternative substrates such as glass and glass-ceramic are found to be more suitable than the traditional NiP-plated aluminum (NiP/Al) substrates. Some of the advantages of using these alternative substrates include lower media noise and lower flight height which could lead to higher recording density. Moreover, these alternative substrates can access to higher temperatures without disk warping that usually happens with NiP/Al at high temperatures. The superior mechanical properties of such alternative substrates also make it possible to reduce disk thickness and size.

To obtain high quality media films, it is necessary to apply dc bias during the film deposition process. However, the dielectric nature of non-metallic substrates causes difficulties in applying dc bias. Moreover, the fast heat loss rate of most non-metallic substrates makes it difficult to sustain the high temperature required for preferred orientation of media films. Consequently, media deposited directly on non-metallic substrates usually exhibit low coercivity and poor recording performance. In order to improve the coercivity, an extra thin metallic seedlayer/sublayer film is needed between the non-metallic substrate and media films. It provides not only the electric conductivity necessary for applying dc bias, but also better growth conditions for the subsequently deposited media films.

Since the optimum deposition process for a seedlayer/sublayer is mainly a sputtering—PVD (Physical Vapor Deposition) process, the sputtering targets of these materials play a very critical role in the guarantee of the sublayer performance and the magnetic media recording layer performance. In addition to the other controlling factors, sputtering targets must be carefully engineered with designed chemistry, composition and purity. Moreover, optimum microstructure and other controlled characteristics must be properly controlled with advanced manufacturing metallurgical processes, otherwise the demanded recording performance of hard disks cannot be achieved.

Advanced metallurgical processes for the manufacturing of high performance targets include hot hydraulic pressing, hot isostatic pressing (HIP), cold isostatic pressing (CIP), and melting.

SUMMARY OF THE INVENTION

The present invention provides metallic compositions of chromium-tantalum oxides (Cr-TaO$_x$). The tantalum oxides include Ta$_2$O$_5$, Ta$_2$O$_4$ and TaO$_2$. These compositions are used to produce sputtering targets for the deposition of thin films in production of high performance magnetic recording media for data storage. Manufacturing methods of sputtering targets of the Cr-TaO$_x$ are also provided by this invention.

Novel sublayers of Cr-TaO$_x$ are used to obtain high coercivity, low-noise, and highly uniform recording media on non-metallic substrates, such as glass-based, ceramic-based, mixed glass/ceramic-based, and polymeric substrates. Polymeric substrates may include polyethylene terephthalate, polycarbonate, polyarylate, polyphenylene ether, polysulfone, polyphenylene sulfide, or polyether ketone. For example, a preferred media comprises a disk-like non-metallic substrate having a Cr-TaO$_x$ sublayer, an underlayer of Cr or Cr alloy, a magnetic Co-based alloy overlayer and a carbon protective layer overcoat.

Deposited films obtained by using Cr-TaO$_x$ targets may be a metallic mixture (Cr-TaO$_x$) or a single phase compound (CrTaO$_x$). It is also to be understood that use of the terms "chromium and tantalum oxide(s)" are intended to cover both a mixture and single phase compound forms of the metallic composition.

Sputtering targets of chromium-tantalum oxide having the most optimal composition and stoichiometric ratio may be selected within ranges of components in accordance with the teachings of this invention. For a particular application, in order to deposit the thin films with repeatable and reproducible characteristics, the composition and stoichiometric ratio must be defined and carefully controlled. A preferred composition consists essentially of chromium or chromium-based alloy and a tantalum oxide of up to 10 atomic percent selected from the group consisting of Ta$_2$O$_5$, TaO$_4$ and TaO$_2$, and mixtures thereof.

Metallurgical processes for manufacturing sputtering targets include hot hydraulic pressing, hot isostatic pressing (HIP) and melting methods. Hot hydraulic pressing uses a consolidation furnace temperature of up to 1800° C. in protective atmospheres, and an unidirectional pressure up to 300 kg/cm$^2$. Without any special required canning or bottling, high density and uniform Cr-TaO$_x$ compositions can be produced for sputtering targets.

Hot isostatic pressing uses a high pressure (15,000 to 40,000 psi) and a high temperature (500–1600° C.) chamber, in which the Cr-TaO$_x$ compositions are consolidated without changing composition and stoichiometric ratio. Target densities are very close to the theoretical density due to the isostatic nature of high pressure applied during the consolidation.

Melting methods for the preparation of Cr-TaO$_x$ compositions in a protective atmosphere or vacuum include electron beam melting, induction melting or arc melting.

Targets of Cr-TaO$_x$ are used to deposit a sublayer film having a thickness between about 25–3000 Å over a non-metallic substrate prior to the deposition of other layers, including the non-magnetic underlayer, magnetic layer, and overcoat. For example, In one general embodiment, the sublayer contains chromium-tantalum oxide (Cr-TaO$_x$) where the tantalum oxide includes chromium-tantalum pentoxide (Cr-Ta$_2$O$_5$) and chromium-tantalum tetrioxide (Cr-Ta$_2$O$_4$ or Cr-TaO$_2$). The preferred concentration for tantalum oxide is up to 10 atomic %.

Other details and embodiments of this invention will be understood with reference to the drawings and the following detailed description.

BRIEF DESCRIPTION OF THE DRAWINGS

FIG. 5 shows perspective views of two typical target geometries, i.e., circular (5A) and rectangular with supporting backing plate (5B).

FIG. 6 is a schematic cross-sectional view of a thin-film recording media structure.

DETAILED DESCRIPTION OF THE INVENTION

Figure 1:
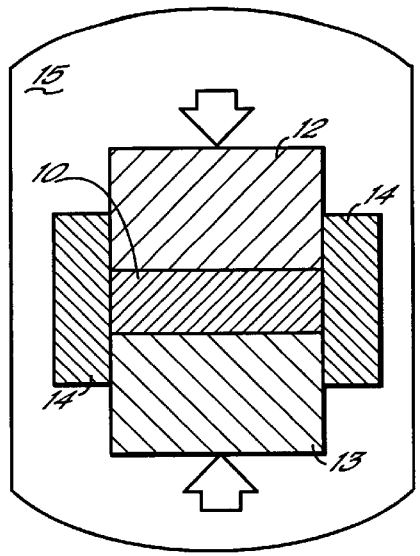
FIG. 1 is a schematic drawing of an example of a hot hydraulic pressing system used for manufacturing the targets of designed composition.

With reference to FIG. 1, a hot hydraulic pressing system may be used to manufacture the Cr-$TaO_x$ target. The Cr-$TaO_x$ components 10 are the alloys or mixtures of Cr-$Ta_2O_5$, or Cr-$TaO_2$, or Cr plus other tantalum oxides having a concentration of oxides up to about 10 atomic %. By placing the blended powdered components having particle sizes less than 200 microns of the Cr-$TaO_x$ 10 between an upper pressing head 12, a lower pressing head 13, and an outer die 14, when the temperature of the die in the furnace 15 is raised, the temperature of the Cr-$TaO_x$ 10 will be raised to up to a maximum of about 1800° C. and the hydraulic force applied to it will create an unidirectional pressure up to 300 kg/cm². In a protective atmosphere or vacuum, or combination of both, the required Cr-$TaO_x$ components will be consolidated to the required properties and reach or be close to the full density (density of the materials is a function of composition and stoichiometric ratio of the tantalum oxides). For Cr-$TaO_x$ target with 1.5 atomic % $Ta_2O_5$, a density of 7.2 g/cm³ was achieved. The Cr-$TaO_x$ obtained will be used to make the sputtering targets for the deposition of the sublayers. Depending on the availability, either induction heating or resistance heating can be applied for the heating of the above process.

Figure 2:
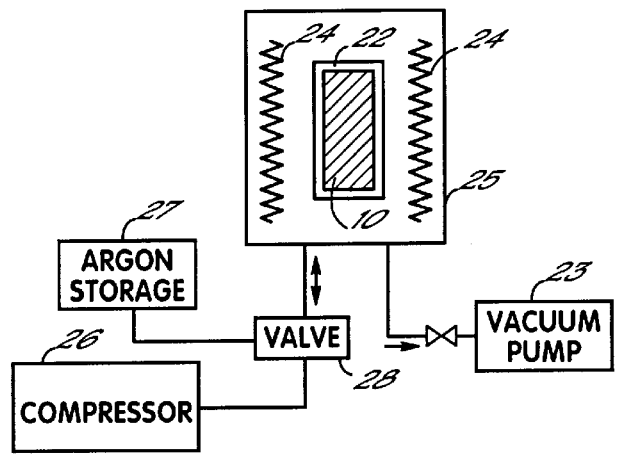
FIG. 2 is a schematic drawing of an example of a hot isostatic pressing system alternatively used for manufacturing the targets of designed composition.

With reference to FIG. 2, a hot isostatic pressing system may be used to manufacture the compositions of Cr-$TaO_x$ components 10 in a sealed container 22, surrounded by heating elements 24, placed in the hot zone of the pressure vessel 25. After an initial vacuum pumping by vacuum pump 23 of vessel 25, the Cr-$TaO_x$ powder blend is subjected to very high isostatic pressure (15,000–40,000 psi) created by the compressed argon from argon storage 27, as compressed by argon compressor 26 and controlled by a valve 28. Heat generated by heating elements 24 bring the Cr-$TaO_x$ powder composition to elevated temperature up to 1600° C. Under those conditions, the Cr-$TaO_x$ is consolidated to or close to the full density similar to what was described in the above paragraph for FIG. 1.

Figure 3:
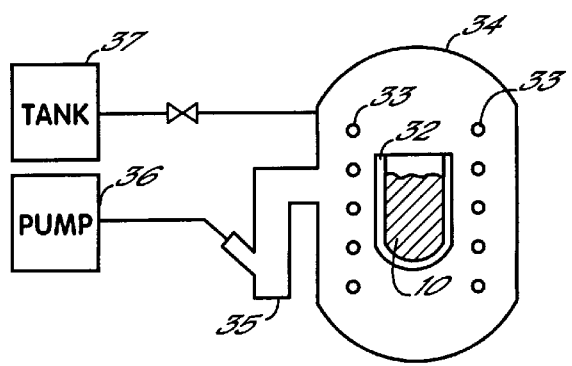
FIG. 3 is a schematic drawing of an induction melting system alternatively used for manufacturing the targets of designed composition.

With reference to FIG. 3, a typical induction melting furnace with vacuum/protective gas capability may be used. The Cr-$TaO_x$ components 10 are placed in a crucible 32 and heated up to a temperature above the melting points of Cr and $TaO_x$ by induction coil 33. The furnace chamber 34 is vacuum pumped first by mechanical pump 36 and then diffusion pump 35, before the back filling of protective gas from tank 37. By alloying the Cr-$TaO_x$ at high temperature, the required components of Cr-$TaO_x$ are consolidated to the required properties similar to what was described above for FIG. 1.

Figure 4:
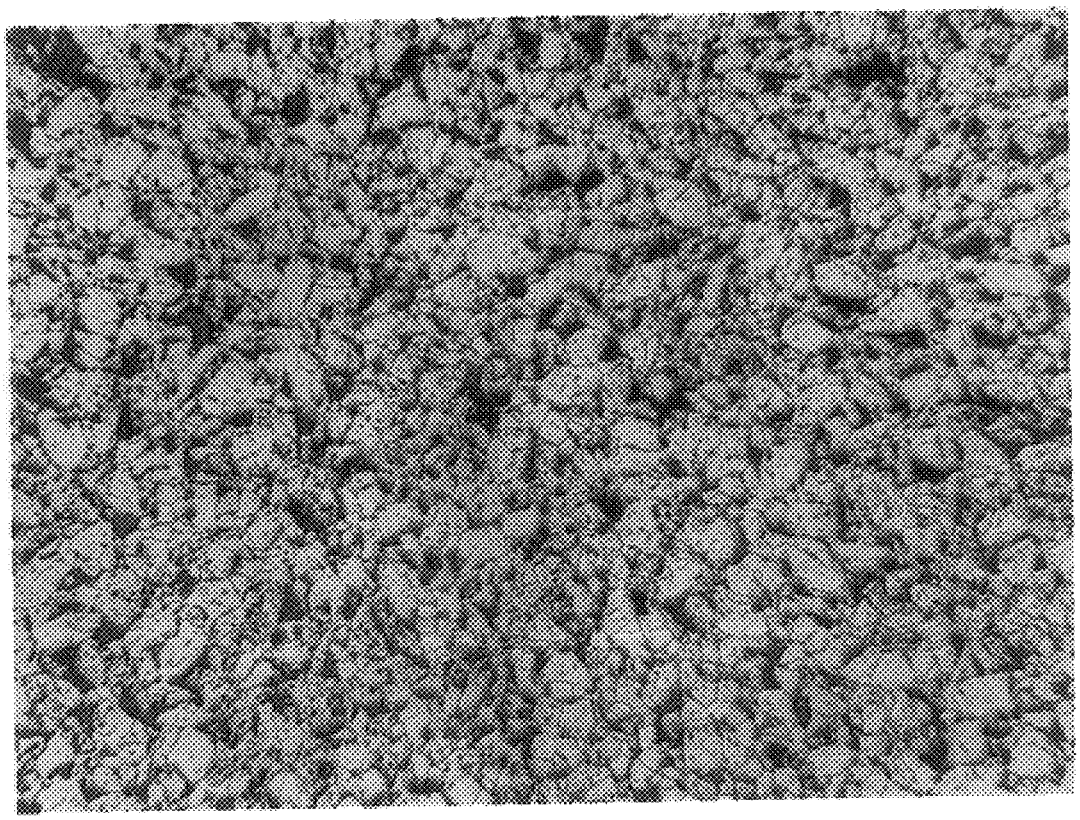
FIG. 4 shows microstructures of an example at 25× magnification of a hot-pressed Cr-$Ta_2O_5$ target.

FIG. 4 shows the microstructure of a hot-pressed Cr-$Ta_2O_5$ target. As shown in the photograph, the second phase of $Ta_2O_5$ is uniformly distributed in the sputtering target.

FIG. 5 shows two examples of sputtering targets used for the deposition of the sublayers of Cr-$TaO_x$, such as a circular target with a center hole (FIG. 5A) and a rectangular shape target 51 with a supporting backing plate 52 (FIG. 5B).

FIG. 6 is a schematic view of the film structure of the recording media. The media comprises a non-metallic substrate such as glass, and a sublayer of Cr-$TaO_x$, a Cr or Cr-alloy underlayer, a Co-based alloy magnetic layer, and a carbon overcoat. In the case of conventional NiP/Al substrates, the magnetic layer and underlayer are usually deposited directly on NiP/Al without an extra seedlayer or sublayer between the substrate and underlayer. Non-metallic substrates include glass, ceramic, glass-ceramic, canasite™, carbon, polymeric, silicon, etc. The surface of substrates can be either polished or textured. As stated above, the sublayer is a chromium-tantalum oxide (Cr-$TaO_x$) or chromium-tantalum oxide based material. More preferably, the sublayer material is chromium-tantalum pentoxide (Cr-$Ta_2O_5$) or chromium-tantalum tetrioxide (Cr-$Ta_2O_4$ or Cr-$TaO_2$) with the tantalum oxide ($Ta_2O_5$, $Ta_2O_4$ or $TaO_2$) concentration up to about 10 atomic %. The preferred thickness of sublayer film is between about 25–3000 Å.

The non-magnetic underlayer film, having a thickness of between 300–3000 Å, is sputtered over the sublayer. Normally, the underlayer material is Cr or Cr-alloy. The magnetic layer is preferably formed by sputtering and has a thickness of between about 100–800 Å. The magnetic layer material is preferably a Co-based alloy, such as CoCrTa, CoCrPt, CoNiTa, CoCrPtTa, CoCrPtTaB, etc. The magnetic layer can consist of multiple layers and with flash layers in between. To provide the wear resistance and other tribology needs, a thin carbon overcoat is deposited on top of the magnetic layer. The preferred thickness of carbon overcoat is between about 50–300 Å.

To illustrate the advantages of the invention, recording disks were sputtered using targets of Cr-$Ta_2O_5$, Cr, CoCrPtTa, and graphite for the sublayer, underlayer, magnetic layer, and protective layer, respectively. Sputtering parameters for magnetic layer and underlayer were fixed for both glass and NiP/Al substrates. Magnetic properties of deposited recording media were measured using a vibrating sample magnetometer (VSM) with saturation field up to 10,000 Oersted (Oe). The recording performances of deposited media disks were tested on a Guzik 1701 spinstand with a 1001 read-write analyzer (RWA).

Figure 7:
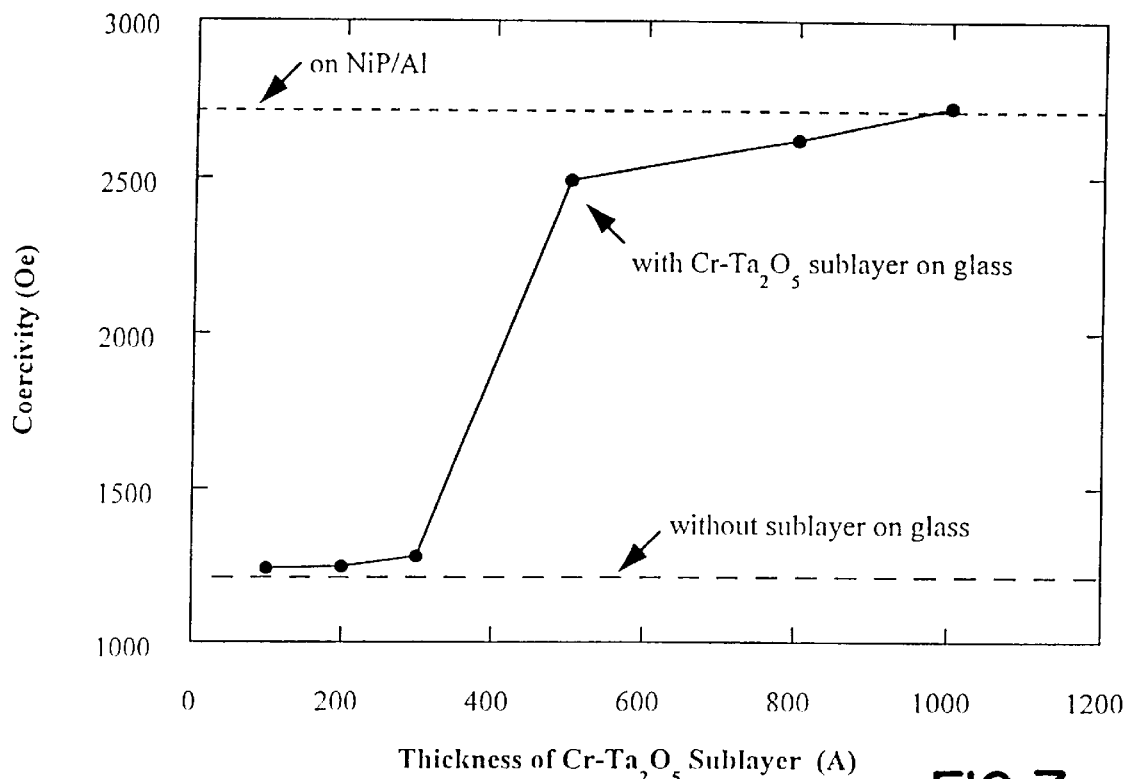
FIG. 7 is a plot of media coercivity as a function of Cr-$Ta_2O_5$ sublayer thickness.

FIG. 7 shows the coercivity of CoCrPtTa/Cr media on NiP/Al and glass substrates. Though the same media on NiP/Al can have a high coercivity of 2700 Oe, it exhibits a coercivity of only 1500 Oe when deposited directly on the glass substrate. Such a low coercivity can be significantly improved by depositing a layer of Cr-$Ta_2O_5$ on the glass substrate first. The data plotted in FIG. 7 show a sharp increase in coercivity once $Cr-Ta_2O_5$ layer thickness reaches over 500 Å. Moreover, coercivity as high as that of media on conventional NiP/Al substrate was observed for $Cr-Ta_2O_5$ sublayer around 1000 Å thick.

Figure 8:
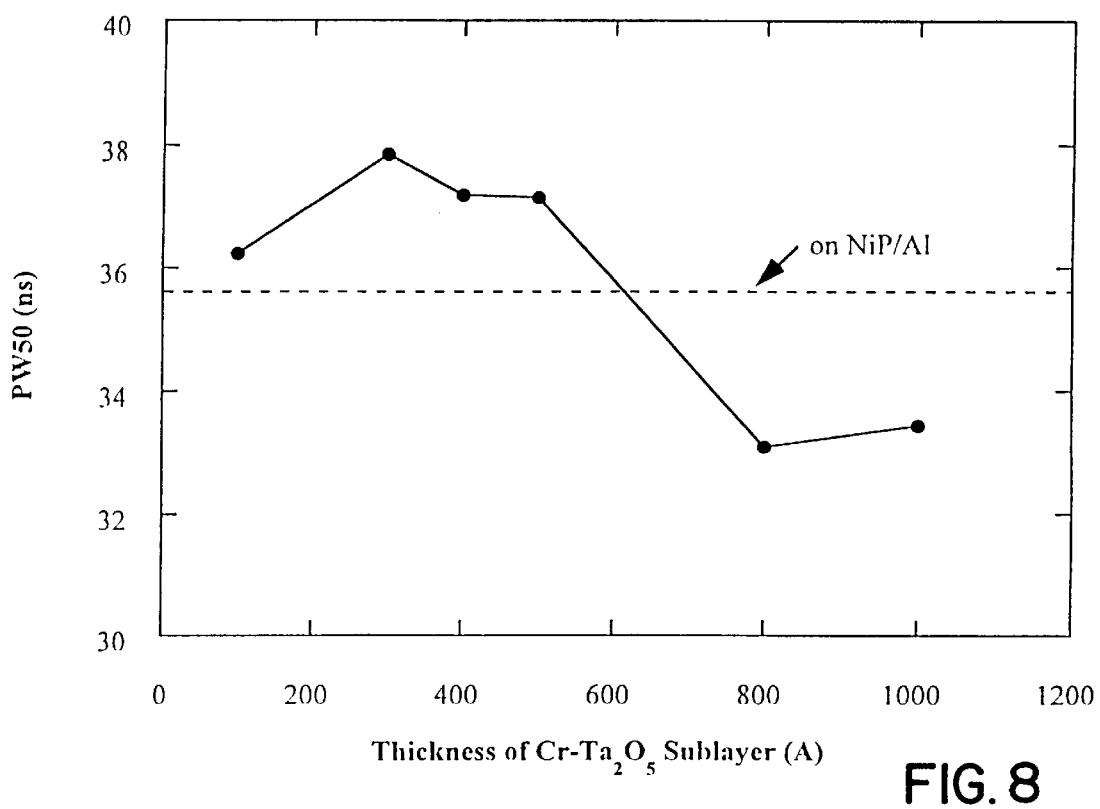
FIG. 8 is a plot of the isolated pulse width (PW50) of recording media deposited on glass substrates as the thickness of Cr-$Ta_2O_5$ sublayer changes.

In FIG. 8, the isolated pulse width (PW50) of media on glass is plotted against sublayer thickness. For $Cr-Ta_2O_5$ sublayer thicker than 500 Å, a pulse width narrower than that of media on NiP/Al substrate (dashed line) was observed.

Figure 9:
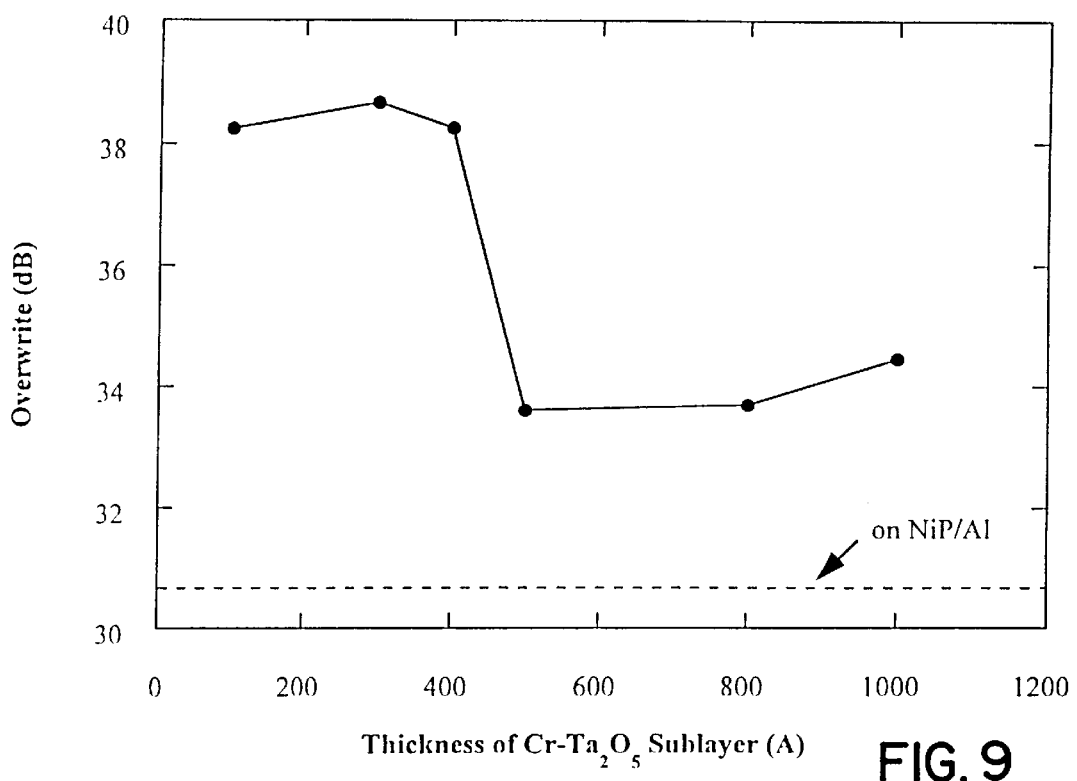
FIG. 9 is a plot of overwrite (OW) of media on glass substrate as a function of Cr-$Ta_2O_5$ sublayer thickness.

FIG. 9 shows the overwrite of media on glass as a function of $Cr-Ta_2O_5$ layer thickness. As a result of coercivity increase, media overwrite drops as $Cr-Ta_2O_5$ layer thickness increases. However, media on glass show a much higher overwrite value than their counterparts on NiP/Al substrate.

Figure 10:
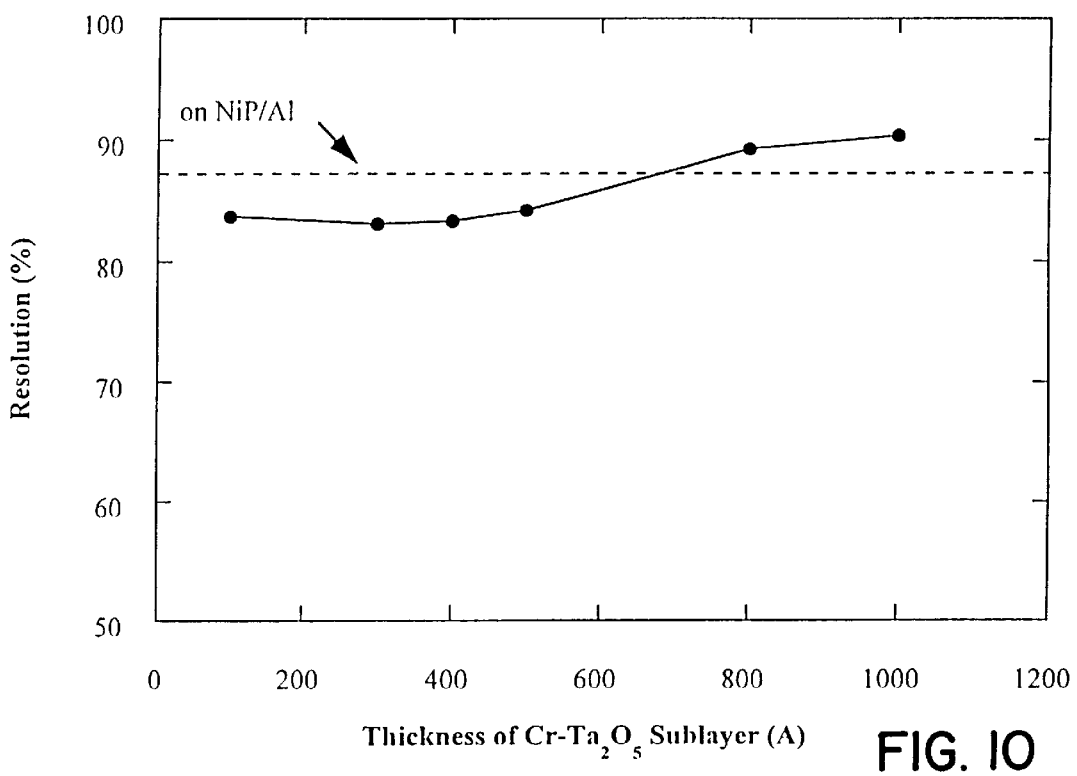
FIG. 10 is a plot of media resolution vs. Cr-$Ta_2O_5$ layer thickness.

Media resolution, which is defined as amplitude ratio between high frequency and low frequency signals, is plotted in FIG. 10. As $Cr-Ta_2O_5$ layer increases over 500-Å thick, an improvement in media resolution was seen. In fact, media with thicker (>500 Å) $Cr-Ta_2O_5$ sublayer demonstrated a higher resolution than media on NiP/Al.

Figure 11:
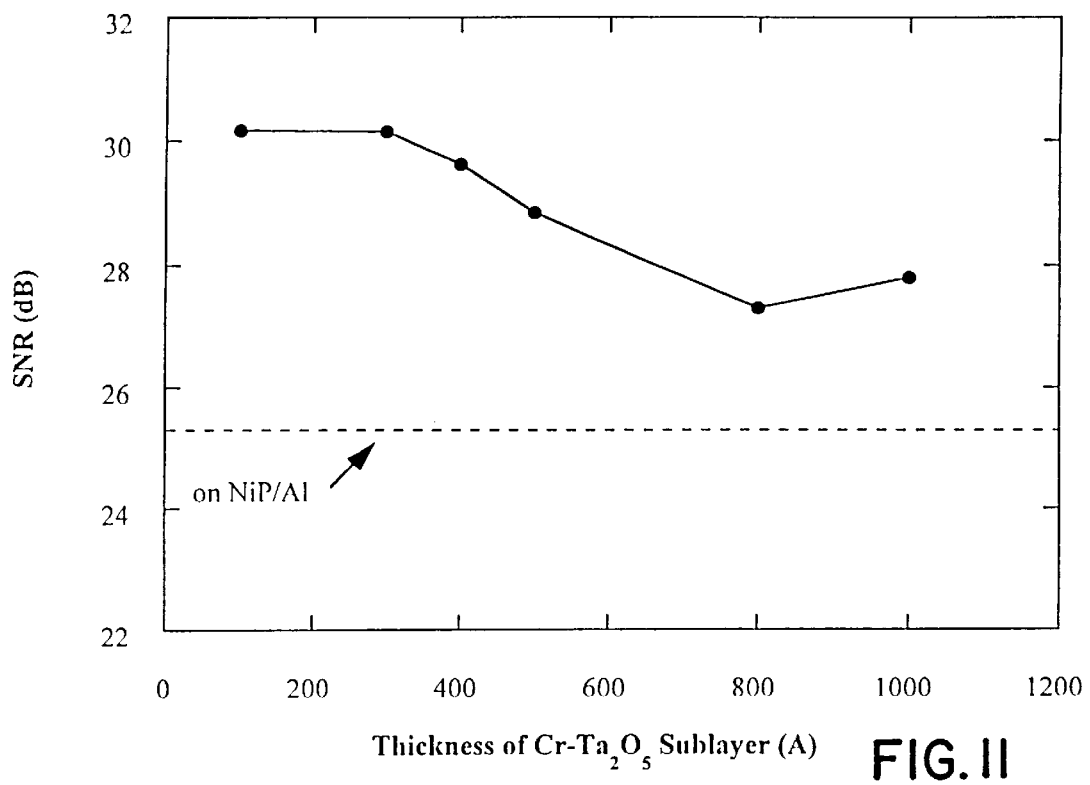
FIG. 11 is a plot of media signal-to-noise ratio (SNR) dependence on Cr-$Ta_2O_5$ sublayer thickness.

Media signal-to-noise ratio (SNR) is displayed in FIG. 11. With the increase of $Cr-Ta_2O_5$ sublayer thickness, a continuous drop of SNR was observed. This may be related to the larger media grain size caused by thicker $Cr-Ta_2O_5$ sublayer. Nevertheless, media on glass substrate exhibit a higher SNR than media on NiP/Al. Even for media with sublayer thicker than 800 Å, a more than 2-dB increase in SNR was observed.

Figure 12:
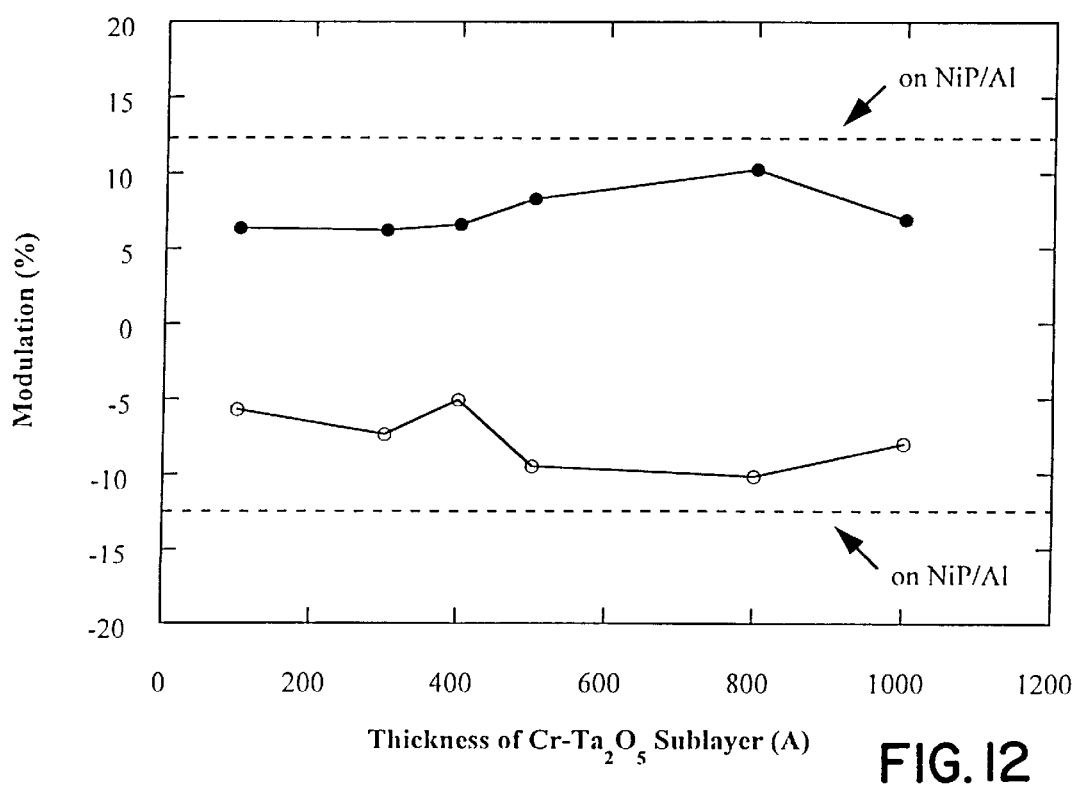
FIG. 12 is a plot of media modulation as a function of Cr-$Ta_2O_5$ sublayer thickness.

Furthermore, media uniformity can be improved by using $Cr-Ta_2O_5$ sublayer. In FIG. 12, both positive and negative modulation of media with $Cr-Ta_2O_5$ sublayer are 30% less than that of media on NiP/Al.

Other embodiments and advantages of this invention will become apparent to a person of ordinary skill in this art in view of the above description and this invention is not be limited to the specific details described above.

What is claimed is:

1. A metallic composition consisting essentially of chromium-tantalum oxide, wherein the tantalum oxide is selected from the group consisting of $Ta_2O_5$, $Ta_2O_4$, and $TaO_2$, and mixtures thereof.

2. A metallic composition consisting essentially of a chromium or chromium-based alloy and a tantalum oxide selected from the group consisting of $Ta_2O_5$, $Ta_2O_4$, and $TaO_2$, and mixtures thereof, said tantalum oxide present in an amount up to 10 atomic percent.

3. A sputtering target comprising a molded element of a composition of claim 2.

4. A sputtering target comprising a molded element of a composition of claim 2.

5. A thin film recording media having magnetic properties for recording and storing information comprising:
    a disk substrate;
    a chromium-tantalum oxide thin film sublayer deposited on said substrate, wherein said tantalum oxide is selected from the group consisting of $Ta_2O_5$, $Ta_2O_4$, and $TaO_2$, and mixtures thereof;
    a non-magnetic metal or alloy underlayer film deposited over said thin film sublayer; and
    a magnetic recording film deposited over said underlayer film.

6. The recording media of claim 5 having up to 10 atomic percent tantalum oxide.

7. The recording media of claim 5 wherein the thin film sublayer deposited using $Cr-TaO_x$ targets is either a metallic mixture ($Cr-TaO_x$) or single phase compound ($CrTaO_x$).

8. The recording media of claim 5 wherein said metal or alloy underlayer is selected from the group consisting of Cr and a Cr alloy.

9. The recording media of claim 5 wherein said magnetic recording film is a Co-based alloy.

10. The recording media of claim 9 wherein said Co-based alloy is selected from the group consisting of CoCrTa, CoCrPt, CoCrNiTa, CoCrPtTa, and CoCrPtTaB.

11. The recording media of claim 5 further comprising a protective coating deposited over said magnetic recording film.

12. The recording media of claim 11 wherein said protective coating is carbon.

13. The recording media of claim 5 wherein said substrate is textured or non-textured.

14. The recording media of claim 5 wherein said substrate is a data storage disk of a material selected from the group consisting of a silica-containing material and polymeric substrates.

15. The recording media of claim 14 wherein said silica-containing material is selected from the group of a glass-based, ceramic-based, and mixed glass/ceramic-based material.

16. The recording media of claim 5 wherein said chromium-tantalum oxide thin film sublayer is approximately 25 to 3000 Å in thickness.

17. A data storage disk having magnetic properties for recording and storing data comprising:
    a recording disk substrate;
    a chromium-tantalum oxide thin film sublayer approximately 25 to 3000 Å in thickness having a tantalum oxide concentration up to 10 atomic % deposited on said substrate, wherein said tantalum oxide is selected from the group consisting of $Ta_2O_5$, $Ta_2O_4$, and $TaO_2$, and mixtures thereof;
    a magnetic recording film of a Co-based alloy deposited over said thin film sublayer;
    a Cr or Cr alloy underlayer deposited between said thin film sublayer and said magnetic recording film; and
    a protective carbon coating deposited over said magnetic recording film.

18. The data storage disk of claim 17 having a substrate material selected from the group consisting of glass, ceramic, mixed glass/ceramic, and polymeric substrates.

19. The data storage disk of claim 17 wherein said Co-based alloy is selected from the group consisting of CoCrTa, CoCrPt, CoCrNiTa, CoCrPtTa, and CoCrPtTaB.

20. The data storage disk of claim 17 wherein said sublayer is a sputtered film having thickness between about 25–3000 Å, said magnetic film is a sputtered magnetic film having thickness between about 100–800 Å; and said carbon coating is a sputtered overcoat having thickness between about 50–300 Å.

21. A method of making a recording media having high magnetic coercivity, low media noise, better uniformity, and other improved recording performance, comprising providing a recording media substrate, depositing a thin film sublayer of chromium-tantalum oxide onto said substrate, wherein said tantalum oxide is selected from the group consisting of $Ta_2O_5$, $Ta_2O_4$, and $TaO_2$, and mixtures thereof, and depositing a magnetic recording film over said chromium-tantalum oxide thin film sublayer.

22. The method according to claim 21 wherein said thin film sublayer of chromium-tantalum oxide is sputter deposited onto said substrate.

23. The method according to claim 21 further comprising depositing a Cr or Cr alloy underlayer film between said thin film sublayer and said magnetic recording film.

24. The method according to claim 21 further comprising depositing a thin protective coating over said magnetic recording film.

25. The method according to claim 21 wherein said protective coating is carbon.

26. The method according to claim 21 wherein said substrate is selected from the group consisting of glass, ceramic, mixed glass/ceramic, and polymeric substrates.

27. The method according to claim 21 wherein said thin film sublayer is approximately 25 to 3000 Å in thickness and has a tantalum pentoxide concentration up to 10 atomic %.

28. The method according to claim 21 wherein said magnetic recording film is a Co-based alloy selected from the group consisting of CoCrTa, CoCrPt, CoCrNiTa, CoCrPtTa, and CoCrPtTaB.

29. The method according to claim 21 comprising providing a disk-like substrate for media deposition, depositing a uniform thin film sublayer of Cr-tantalum oxide onto said substrate, depositing an underlayer over the said Cr-tantalum oxide thin film sublayer, depositing a magnetic recording film over the underlayer, and depositing a protective overcoat over the magnetic film.

30. The method according to claim 29 wherein said thin film sublayer of Cr-tantalum oxide is sputtered onto the said substrate from a sputtering target of chromium-tantalum oxide.

31. The method according to claim 29 wherein said thin film sublayer Cr-tantalum oxide is coated onto the said substrate by spray, evaporation, reactive sputtering, co-sputtering, other physical vapor deposition or chemical vapor deposition methods.

32. The method according to claim 29 wherein said substrate is a data storage disk formed of glass-based, ceramic-based, mixed glass/ceramic-based, or other silica-containing material.

33. The method according to claim 29 wherein said substrate is textured or non-textured.

34. The method according to claim 29 wherein said thin film sublayer is approximately 25 to 3000 Å in thickness and has a tantalum pentoxide concentration up to 10 atomic %.

35. The method according to claim 29 wherein said magnetic recording film is a Co-based alloy selected from the group consisting of CoCrTa, CoCrPt, CoCrNiTa, CoCrPtTa, and CoCrPtTaB.

* * * * *